(12) United States Patent
De Vos et al.

(10) Patent No.: US 11,769,750 B2
(45) Date of Patent: Sep. 26, 2023

(54) SUBSTRATE, ASSEMBLY AND METHOD FOR WAFER-TO-WAFER HYBRID BONDING

(71) Applicant: IMEC VZW, Leuven (BE)

(72) Inventors: Joeri De Vos, Neerwinden (NL); Eric Beyne, Heverlee (BE)

(73) Assignee: Imec VZW, Leuven (BE)

( * ) Notice: Subject to any disclaimer, the term of this patent is extended or adjusted under 35 U.S.C. 154(b) by 0 days.

(21) Appl. No.: 17/387,617

(22) Filed: Jul. 28, 2021

(65) Prior Publication Data

US 2022/0037283 A1  Feb. 3, 2022

(30) Foreign Application Priority Data

Jul. 29, 2020 (EP) .................................. 20188282

(51) Int. Cl.
*H01L 23/538* (2006.01)
*H01L 23/00* (2006.01)
*H01L 27/06* (2006.01)

(52) U.S. Cl.
CPC .......... *H01L 24/80* (2013.01); *H01L 23/5385* (2013.01); *H01L 23/5386* (2013.01); *H01L 27/0688* (2013.01)

(58) Field of Classification Search
CPC .... H01L 23/5386; H01L 24/29; H01L 21/187
See application file for complete search history.

(56) References Cited

U.S. PATENT DOCUMENTS 11,256,004 B2 * 2/2022 Haba ...................... G02B 27/14
2013/0020704 A1 1/2013 Sadaka (Continued)

FOREIGN PATENT DOCUMENTS

JP 2011-049270 A 3/2011

OTHER PUBLICATIONS

Beyne, E., et al., "Scalable, Sub 2μm Pitch, Cu/SiCN to Cu/SiCN Hybrid Wafer-to-Wafer Bonding Technology", 2017 IEEE International Electron Devices Meeting (IEDM), San Francisco, CA, 2017, pp. 32.4.1 to 32.4.4.

(Continued)

*Primary Examiner* — Dale E Page
*Assistant Examiner* — Wilner Jean Baptiste
(74) *Attorney, Agent, or Firm* — McDonnell Boehnen Hulbert & Berghoff LLP

(57) ABSTRACT

A substrate, assembly and method for bonding and electrically interconnecting substrates are provided. According to the method, two substrates are provided, each comprising metal contact structures that are electrically isolated from each other by a bonding layer of dielectric material. Openings are produced in the bonding layer, the openings lying within the surface area of the respective contact structures, exposing the contact material of the structures at the bottom of the openings. Then a layer of conductive material is deposited, filling the openings, after which the material is planarized, removing it from the surface of the bonding layer and leaving a recessed contact patch in the openings. The substrates are then aligned, brought into contact, and bonded by applying an annealing step at a temperature suitable for causing thermal expansion of the contact structures. Deformation of the conductive material of the contact structures through creep pushes the material into the openings from the bottom up, thereby bringing the contact patches into mutual and conductive contact.

5 Claims, 7 Drawing Sheets

(56) References Cited

U.S. PATENT DOCUMENTS

| | | |
|---|---|---|
| 2017/0358553 A1* | 12/2017 | Kim .................... H01L 24/02 |
| 2018/0350674 A1 | 12/2018 | Uzoh |
| 2019/0385963 A1 | 12/2019 | Chen et al. |
| 2020/0051937 A1 | 2/2020 | Uzoh et al. |
| 2020/0235063 A1 | 7/2020 | Chen et al. |

OTHER PUBLICATIONS

Kim, S-W., et al., "Novel Cu/SiCN Surface Topography Control for 1 μm Pitch Hybrid Wafer-to-Wafer Bonding", 2020 IEEE 70th Electronic Components and Technology Conference (ECTC), 2020, pp. 216-222.

Extended European Search Report from the European Patent Office, dated Jan. 22, 2021, for European Patent Application No. 20188282.6, pp. 1-33.

* cited by examiner

SUBSTRATE, ASSEMBLY AND METHOD FOR WAFER-TO-WAFER HYBRID BONDING

CROSS-REFERENCE

The present application claims priority to European Patent Application No. EP 20188282.6, filed on Jul. 29, 2020, which is incorporated by reference in its entirety.

FIELD OF THE DISCLOSURE

The present disclosure is related to semiconductor processing, in particular to 3D integration technologies.

BACKGROUND OF THE DISCLOSURE 3D integration generally refers to the stacking and interconnection of integrated circuits or functional partitions thereof. Driven by the continuous scaling of micro-electronic circuits, the challenges in terms of the dimensions and pitch of interconnect structures, such as contact bumps or pads, has become ever more important. For so-called 'system-on-chip', SOC, applications, functional partitions of an integrated circuit are generally stacked and interconnected, requiring very small dimensions of the contact structures and of the pitch of arrays of such structures.

Wafer-to-wafer bonding technology has enabled the realization of contact pads of micron down to submicron dimensions, arranged in dense arrays, and the direct bonding of such arrays through hybrid bonding techniques. Hybrid bonding refers to the bonding of two wafers, the bonding surfaces thereof comprising each a dielectric bonding layer and metal contact areas. Bonding takes place by bringing the surfaces together and establishing a dielectric-dielectric bond as well as a metal-metal electrically conductive connection by annealing and possibly by applying a mechanical pressure.

A presently applied method of bonding fine-pitch arrays of submicron metal pads by wafer-to-wafer bonding is illustrated in scalable, sub 2 μm pitch, Cu/SiCN to Cu/SiCN hybrid wafer-to-wafer bonding technology, "E. Beyne et al, 2017 IEEE International Electron Devices Meeting (IEDM), San Francisco, Calif., 2017, pp. 32.4.1-32.4.4, doi: 10.1109/IEDM.2017.8268486". The document refers to specially developed CMP (Chemical Mechanical Polishing) recipes for obtaining a slightly protruding Cu pad in the top wafer and a recessed Cu pad in the bottom wafer. The top pad can be smaller than the bottom pad in order to avoid Cu-dielectric contact. The bonding dielectric is SiCN, which can enables a high wafer-to-wafer bonding energy. The bond anneal causes thermal expansion of the Cu, which establishes a good Cu—Cu contact between the recessed Cu pad and the protruding Cu pad. However, the requirement of a smaller contact pad on the top wafer obstructs further scaling down of the pad dimensions and pitch. Also, cavity formation along the edges of the pad is observed for certain combinations of materials, notably for a Cu pad separated from a $SiO_x$ layer by a Ta-containing diffusion barrier. The CMP causes galvanic corrosion along the edges of the pad, leading to the cavity formation. Also, when the bond is first established, gaps are formed between the larger pad and the SiCN layer surrounding the smaller pad. These gaps need to be filled by the thermal expansion of the Cu before any remaining gaps (between the top and bottom wafer bond pads) and cavities (close to pad edges) can be filled through Cu deformation. The amount of linear thermal expansion of the Cu pads can be rather limited. However, if the gap between the Cu and the SiCN layer surrounding the smaller pad is filled with Cu, larger hydrostatic stress can develop in the Cu pad, resulting in Cu creep towards the remaining cavities. In particular, this effect can push the Cu outward from the remaining gap between the two Cu pads, until the gap is completely filled with Cu and the two Cu pads weld together. This 'bulge-out' of the copper can facilitate the formation of the Cu—Cu contact, particularly in case of CMP variations causing a large spread in the top-pad Cu to bottom-pad Cu distance. The presence of excessive gaps and cavities however may prevent the onset of this Cu creep mechanism and cause defective Cu—Cu bonds. Cavities may also remain in the Cu bond after the bond anneal, leading to unsatisfactory electrical connections, more susceptible to cavity migration due to electrical current stress (electromigration).

SUMMARY OF THE DISCLOSURE

The disclosure aims to provide a solution to the problems highlighted above. This aim is achieved by the method, substrates and substrate assemblies in accordance with the appended claims. According to the method of the disclosure, two substrates are provided, each comprising metal contact structures located on the surface of the substrates and configured to realize an electrical connection between the substrates in a wafer-to-wafer type hybrid bonding process. Initially the contact structures are electrically isolated from each other by a layer of dielectric material. According to the disclosure, a number of processing steps are performed prior to bonding, on each of the substrates. First, a dielectric bonding layer can be produced on the substrates, generally by depositing and subsequently thinning a dielectric layer, and then openings are produced in the bonding layer, the openings lying within the surface area of the respective contact structures, exposing the contact material of said structures at the bottom of the openings. The size of these openings can thus smaller than the underlying metal structures. Then a layer of electrically conductive material can be deposited, filling the openings, after which said conductive material can be planarized, removing it from the surface of the dielectric bonding layer and leaving a recessed contact patch in the openings. The wafers can then be aligned, brought into contact, and the bond is completed by applying an annealing step at a temperature suitable for causing thermal expansion of the contact structures. The anneal can cause the deformation of the conductive material of the contact structures through creep, which pushes the material into the openings from the bottom up, thereby bringing the contact patches into mutual and electrically conductive contact by welding the patches together. Through the prior creation of the opening and the fact that these openings are smaller than the surface area of the contact structures, the deformation through creep takes place as soon as the anneal temperature is applied.

The bonding layer deposited after the creation of the contact structures, and the formation of the openings and contact patches can reduce the risk of cavity formation in the eventual bonds, and enables an optimized use of the effects of the thermal expansion on the contact material of the contact structures.

The contact structures are usually contact pads having a planar contact surface that is essentially co-planar with the surface of the layer of dielectric material that electrically isolates the contact structures from each other.

According to the disclosure, the contact structures can be configured so that said structures undergo a thermal expansion during the anneal step.

The disclosure is in particular related to a method for bonding and electrically interconnecting substrates comprising micro-electronic devices and/or circuitry, wherein a first substrate and a second substrate are provided, each substrate comprising on its surface one or more contact structures formed of an electrically conductive material, which are to be electrically connected to corresponding contact structures on the other substrate, the contact structures on each substrate being laterally embedded in a layer of dielectric material that electrically isolates the contact structures from each other,
characterized in that:
  prior to bonding, the following steps are performed on each substrate:
    producing on the substrate a dielectric bonding layer,
    producing above each of said one or more contact structures an opening in the bonding layer, thereby exposing the surface of the respective bonding structures at the bottom of the openings, wherein the surface area of the openings is lying within the respective boundaries of the surface area of the contact structures,
    depositing a layer of an electrically conductive material on the substrate, thereby filling the openings with the conductive material of said layer,
    thinning the layer of conductive material, thereby removing said material from the surface of the bonding layer, and planarizing said bonding layer, wherein the planarization is configured so that a patch of the conductive material of said layer remains in each of the openings, the patches being recessed relative to the planarized surface of the bonding layer,
  bonding of the substrates and realizing an electrically conductive connection between the contact structures is performed by:
    aligning the first substrate relative to the second substrate, so that corresponding patches of the one or more contact structures on both wafers are at least partially overlapping,
    bringing the dielectric bonding layers of the substrates into mutual contact,
    annealing the mutually contacted substrates, at a temperature suitable for causing thermal expansion of the conductive material of the contact structures and realizing an electrically conductive connection between the patches and thereby between the contact structures. As stated above, the annealing step can be configured to cause the deformation of the conductive material of the contact structures through creep, which pushes the material into the openings from the bottom up, thereby bringing the contact patches into mutual and electrically conductive contact by welding the patches together.

According to an embodiment, the step of producing a dielectric bonding layer includes annealing the layer at a temperature that does not cause full thermal expansion of the contact structures or wherein said step includes curing the dielectric bonding layer by ultraviolet light.

According to an embodiment, any cavities present in the upper surface of at least one of the contact structures, at the interface between the surface of the contact structure and a diffusion barrier separating the structure from the isolating material, are filled with the material of the dielectric bonding layer when the latter is deposited on the substrate.

According to an embodiment, the lateral dimensions of the contact structures are smaller than 2 μm, typically smaller than 1 μm.

According to an embodiment, the electrically conductive material of the contact structures and of the contact patches is a metal. In this case, the conductive layer deposited on the substrates for filling the openings may be deposited by Physical Vapour Deposition.

According to an embodiment, the dielectric bonding layers on the two substrates can be layers of SiCN or SiCO.

According to an embodiment, the surface area of the opening on each substrate can range between 25% and 50% of the surface area of the underlying contact structure.

According to an embodiment, the dielectric bonding layer on at least one of the substrates can be formed of a material suitable for acting as a diffusion barrier for the conductive material of the contact structure, wherein no diffusion barrier is produced between the conductive patch and the sidewall of the opening.

According to an embodiment, the surface area of the contact structures of the first substrate can be equal in size and shape to the surface area of the corresponding contact structures of the second substrate and/or the surface area of the openings of the first substrate can be equal in size and shape to the surface area of the corresponding openings of the second substrate.

The disclosure can be equally related to a substrate comprising micro-electronic devices and/or circuitry, the substrate comprising on its surface one or more contact structures formed of an electrically conductive material, the contact structures being laterally embedded in a layer of dielectric material that electrically isolates the contact structures from each other, the substrate further comprising:
  a dielectric bonding layer on the surface of the substrate, the dielectric bonding layer comprising above each of said one or more contact structures an opening, wherein the surface area of the openings is lying within the respective boundaries of the surface area of the contact structures,
  In each opening: a patch of an electrically conductive material, lying on and in contact with the surface of the contact structure underneath said opening, the patches being recessed relative to the surface of the bonding layer.

Said one or more contact structures can be electrically connected through a bonding process comprising an anneal step, to corresponding contact structures on another substrate.

According to an embodiment of the substrate according to the disclosure, the lateral dimensions of the contact structures are smaller than 2 μm, typically smaller than 1 μm.

According to an embodiment of the substrate according to the disclosure, the conductive material of the contact structures and of the patches is a metal and the metal of the patches has a different crystallographic orientation than the metal of the contact structures.

The substrate according to the disclosure may comprise a diffusion barrier between at least one contact structure of said substrate, and the layer of dielectric material that electrically isolates the contact structures from each other, wherein any cavities present in the upper surface of at said least one contact structure, at the interface between the surface of the contact structure and the diffusion barrier, are filled with the material of the dielectric bonding layer.

The disclosure is equally related to a substrate assembly comprising at least two bonded substrates obtained or obtainable by bonding and electrically interconnecting a first and second substrate according to the disclosure, by applying the method according to the disclosure.

DETAILED DESCRIPTION OF THE DISCLOSURE

Figure 1:
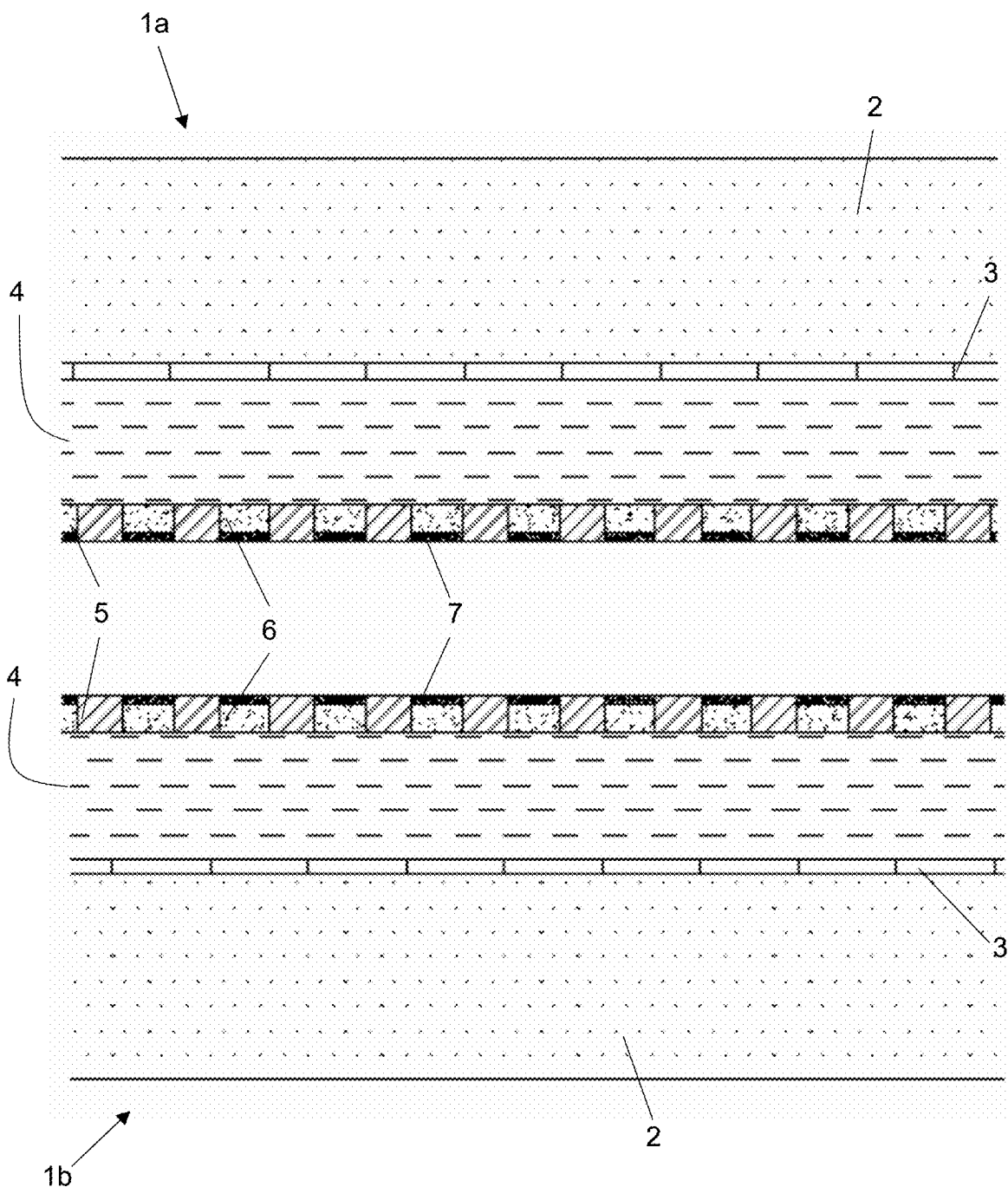
FIG. 1 shows two wafers processed according to the prior art and aligned prior to bonding.

FIG. 1 illustrates a typical prior art wafer-to-wafer bonding situation, where a top wafer 1a is aligned to a bottom wafer 1b before the two are brought together for bonding. The wafers have been prepared for bonding according to conventional methods. The drawing in FIG. 1 is a schematic representation of a small section of the wafers, which could for example correspond to an area of a few tens of square micrometres of two integrated circuit chips (ICs) which have been processed on the wafers. Both ICs comprise a substrate portion 2, a front end of line portion 3 comprising active devices such as transistors or diodes, and a back end of line portion 4 which is a multilevel structure of interconnected electrical conductors and vias designed to provide power and signal routing to the active devices, and embedded in an electrically isolating dielectric material often referred to as interlayer dielectric, usually silicon oxide (hereafter referred to as $SiO_x$). Each IC comprises an array of Cu contact pads 5 connected to the top level of the BEOL portion 4 of both chips. In the plane of the wafers, the pads 5 may have a more or less rectangular or round cross-section defined by respective lateral dimensions (diameter, side lengths). The contact pads 5 may have a thickness in the order of 1 μm or less, and lateral dimensions in the same order or a little higher, up to 2 μm for example. The pitch of the arrays is of similar magnitude. These dimensions do not limit the scope of the disclosure but are used as examples only.

The pads 5 can be laterally embedded in dielectric material which isolates the pads electrically from each other, i.e. a layer of dielectric material surrounds the structures, leaving their upper surface free. In the embodiment shown, the electrically isolating layer can be a stack of a first dielectric layer 6 which may be formed of the same dielectric material as the interlayer dielectric used in the fabrication of the BEOL portion 4, for example $SiO_x$, and a bonding layer 7 formed of a second dielectric material suitable for direct dielectric-dielectric bonding, for example SiCN or SiCO. SiCN will be used by way of non-limiting example in this detailed description. The pads 5 may be processed by the well-known damascene-type processing used for producing BEOL type interconnect structures. Usually, a diffusion barrier (not shown in FIG. 1) is present between the contact pads 5 and the dielectric stack 6+7.

The wafers 1a and 1b can be bonded by bringing the SiCN layers 7 of both wafers into contact, possibly under mechanical pressure, and applying an annealing step, i.e. raising the temperature of the assembly to a pre-defined level and holding the temperature at said level for a pre-defined time, the anneal temperature and time being suitable for realizing strong SiCN—SiCN bonds as well as an electrical connection between the Cu-pads 5 of the two wafers. As stated in the introduction, conventional preparation of the bonding surfaces may include planarization using dedicated CMP recipes which can result in recessed and protruding Cu contacts. Also, the lateral dimensions of the pads of the top wafer could be made smaller than those of the bottom wafer or vice versa. However, despite such measures, a number of problems persist such as cavity formation, and some of these measures can obstruct further scaling down of the pad dimensions.

Pre-bond processing of the wafers 1a and 1b in accordance with an embodiment of the disclosure will now be described. The disclosure is not limited to contact pads and bonding layers of the abovenamed dimensions and materials, nor to any materials and dimensions cited in the remainder of this detailed description, but the context of micron or submicron-sized contact pads represents a particular field of application for the disclosure, and therefore the present description uses this context for explaining the characteristic features.

Figure 2A:
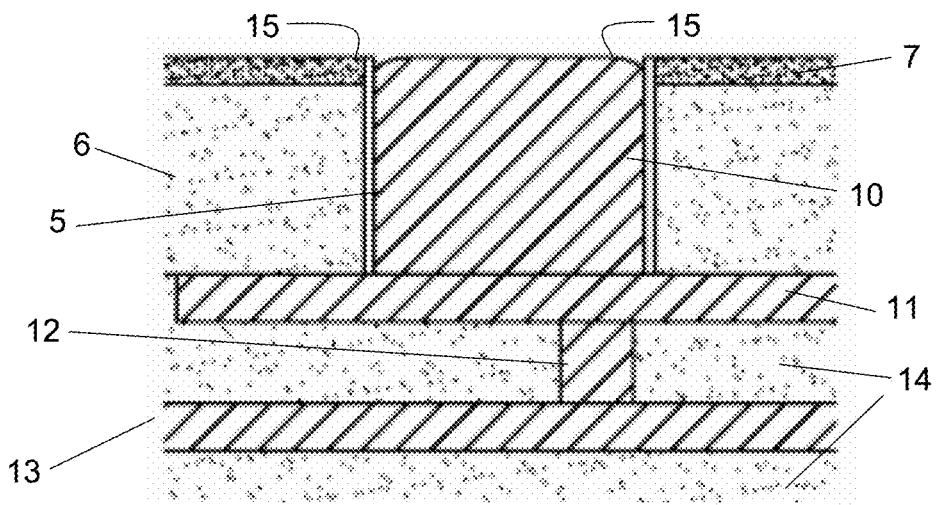
FIGS. 2a to 2f illustrate method steps performed on a wafer prior to bonding, according to an embodiment of the disclosure.

FIG. 2a shows a detail of one contact pad 5, as produced by a damascene-type process known as such in the art. A tantalum-containing diffusion barrier 10 may be present between the dielectric stack 6+7 and the pad 5. The pad 5 contacts a conductor 11 of the upper BEOL level, itself connected by a via 12 to a conductor 13 of the adjacent level, said conductors being embedded in interlayer dielectric material 14. The planar upper surface of the wafers can be obtained by CMP. According to the disclosure, no deliberate measures are taken for obtaining a protruding or recessed Cu pad relative to the SiCN layer 7. After CMP, the Cu pad 5 can therefore be essentially coplanar with the SiCN layer 7, even though a slight recess or protrusion of a few nm is allowable. However, regardless of such intended or unintended recess or protrusion appearing, the CMP-ing of the combination Cu—SiCN with a Ta-based diffusion barrier 10 can cause cavities to appear at the interface between the surface of the Cu pads 5 and the diffusion barrier 10 due to galvanic corrosion. These cavities 15 are visualized in the drawing in FIG. 2a.

Figure 2B:
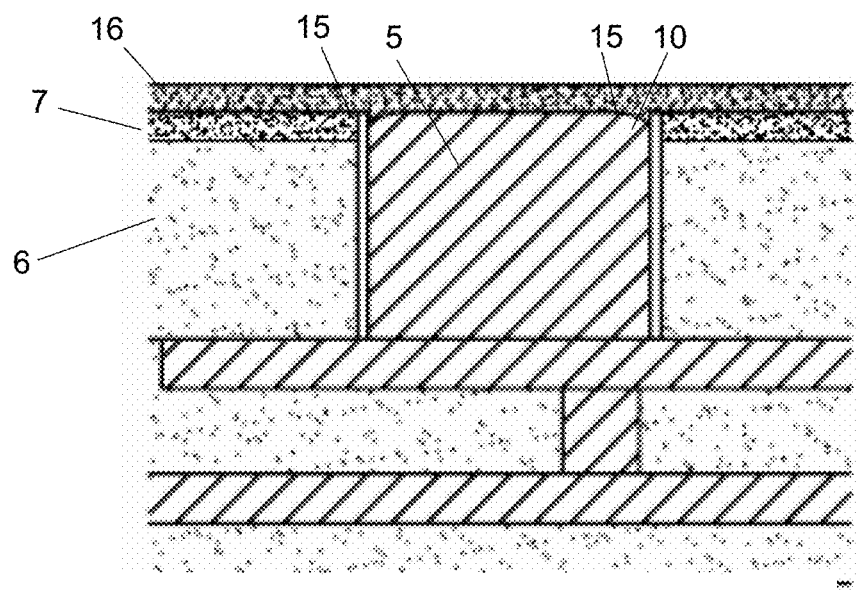

According to the disclosure, a dielectric bonding layer 16 can now be deposited on the wafer, as illustrated in FIG. 2b. Generally, this layer is itself a Cu-diffusion barrier. According to one embodiment, layer 16 is a layer of SiCN with a thickness which may be between 20 and 50 nm. SiCN can act as a diffusion barrier against diffusion of Cu. So, in this case a second SiCN layer 16 can applied on top of the first SiCN layer 7. The presence of the first SiCN layer 7 may be used based on specific features of the CMP process for planarizing Cu and SiCN compared to Cu and $SiO_x$. However, in the broader scope of the disclosure, layer 7 is optional, and the dielectric bonding layer 16 may be deposited directly on the dielectric 6 and Cu pads 5 after planarization of the latter, as will be described in more detail further in this description.

The second SiCN layer 16 can be applied by any method known in the art. Any such method may include a deposition step and a post-treatment for improving the adhesion of the SiCN layer 16 and densifying said layer 16. The post-treatment may be an annealing step, generally taking place at the lower end of the temperature range available for such methods, in order to minimise the thermal expansion of the Cu pads 5 during this anneal process. For example, a 50 nm layer of SiCN is deposited by Chemical Vapour Deposition (CVD), and subsequently annealed during a time span of 2 h at 370° C. in a N$_2$ atmosphere. As seen in the drawing, the second SiCN layer 16 effectively fills the cavities 15. Alternatively, the post-treatment may be a UV curing step, which is more beneficial in terms of controlling the thermal budget and minimizing any Cu expansion during the pre-treatment.

Figure 2C:
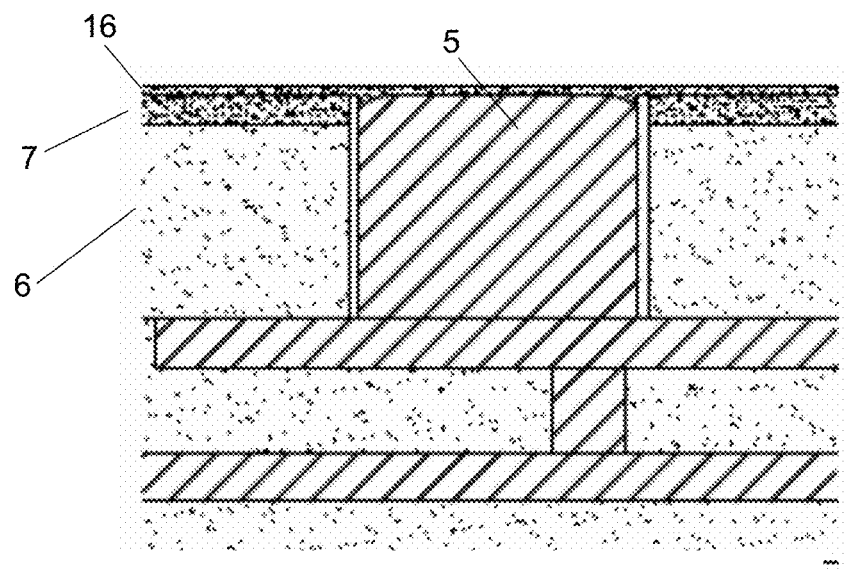
Figure 2D:
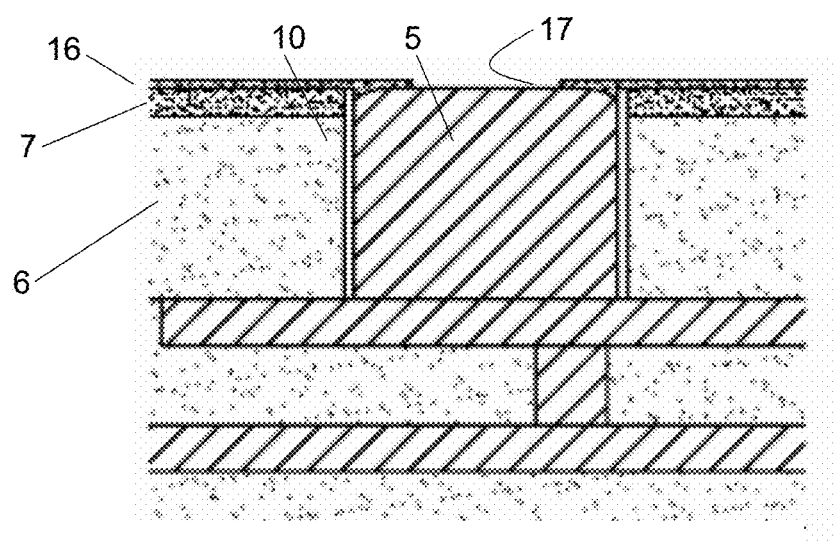

As illustrated in FIG. 2c, the second SiCN layer 16 can then be planarized by CMP, typically also reducing its thickness. The planarized SiCN layer 16 may have a thickness between 5 and 50 nm. Then an opening 17 can be produced in the thinned SiCN layer 16, by lithography and etching through the SiCN material of layer 16, see FIG. 2d. The surface area of the opening 17 may be smaller than the surface area of the pad 5 and the opening is located fully within the surface area of the pad 5. In the drawing, the opening 17 is shown to be fully concentric with the pad 5, but the opening may be located slightly out of centre, on account of the overlay accuracy range of the lithography tool used for producing the opening 17. The lateral dimensions of the opening 17 are designed so that within said accuracy range, the opening is certain to be situated within the boundaries of the contact pad 5. The opening 17 can be etched until the Cu of the pad 5 is exposed at the bottom of the opening.

Figure 2E:
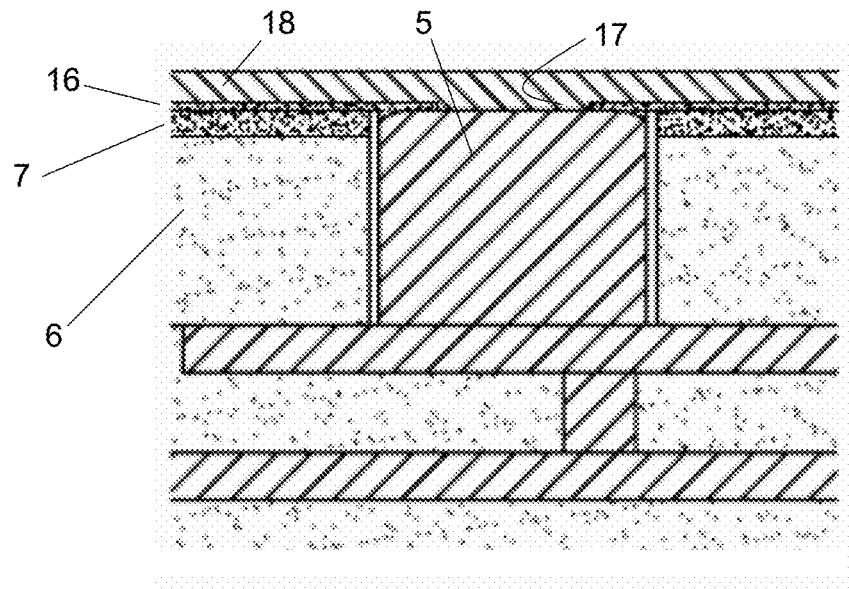
Figure 2F:
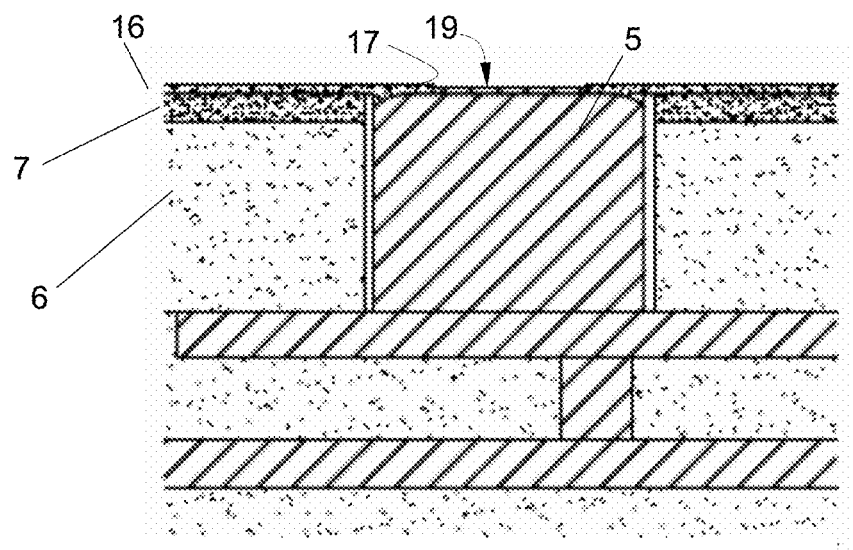

Now a layer of Cu 18 can be deposited, typically by Physical Vapour Deposition (PVD), as illustrated in FIG. 2e. The thickness of the layer 18 may be about 100 nm for example. The PVD-applied layer 18 fills the opening 17. This is followed (see FIG. 2f) by a CMP step, applying a CMP recipe configured to remove the Cu from the surface of the SiCN layer 16, further planarize said layer 16 and realize a slight recess of the remaining Cu patch 19 in the opening 17. Because SiCN is itself a Cu diffusion barrier, no additional barrier is needed along the sidewalls of the Cu patch 19 in the opening 17, and the CMP-ing of this Cu patch 19 does not lead to cavity formation at the edges because of the absence of a galvanic effect between a metallic barrier and the Cu.

Figure 3A:
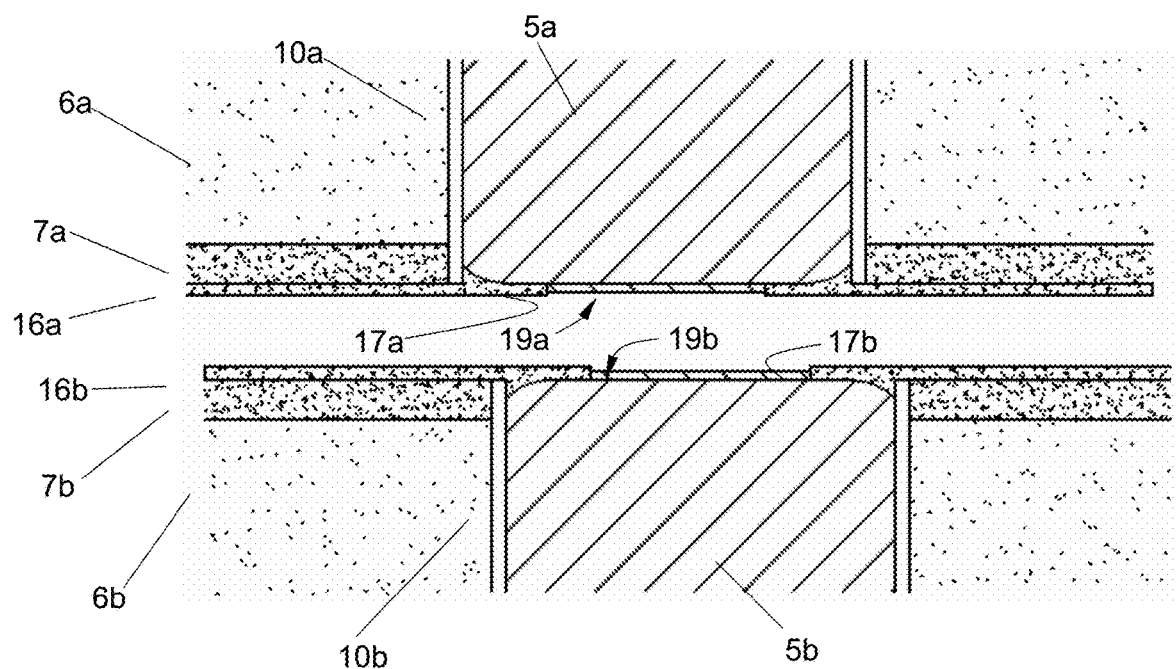
FIGS. 3a to 3c illustrate the bonding process of two wafers in accordance with an embodiment of the disclosure.
Figure 3B:
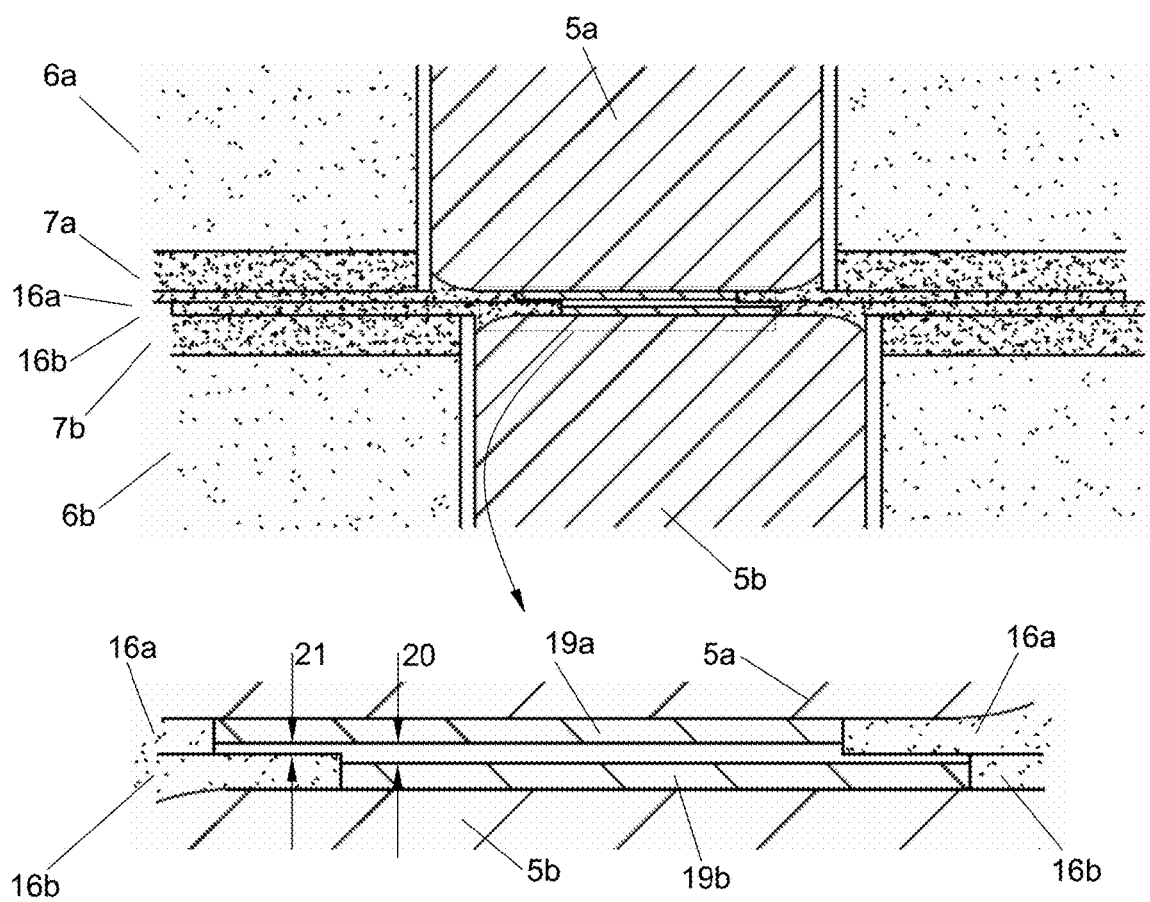
Figure 3C:
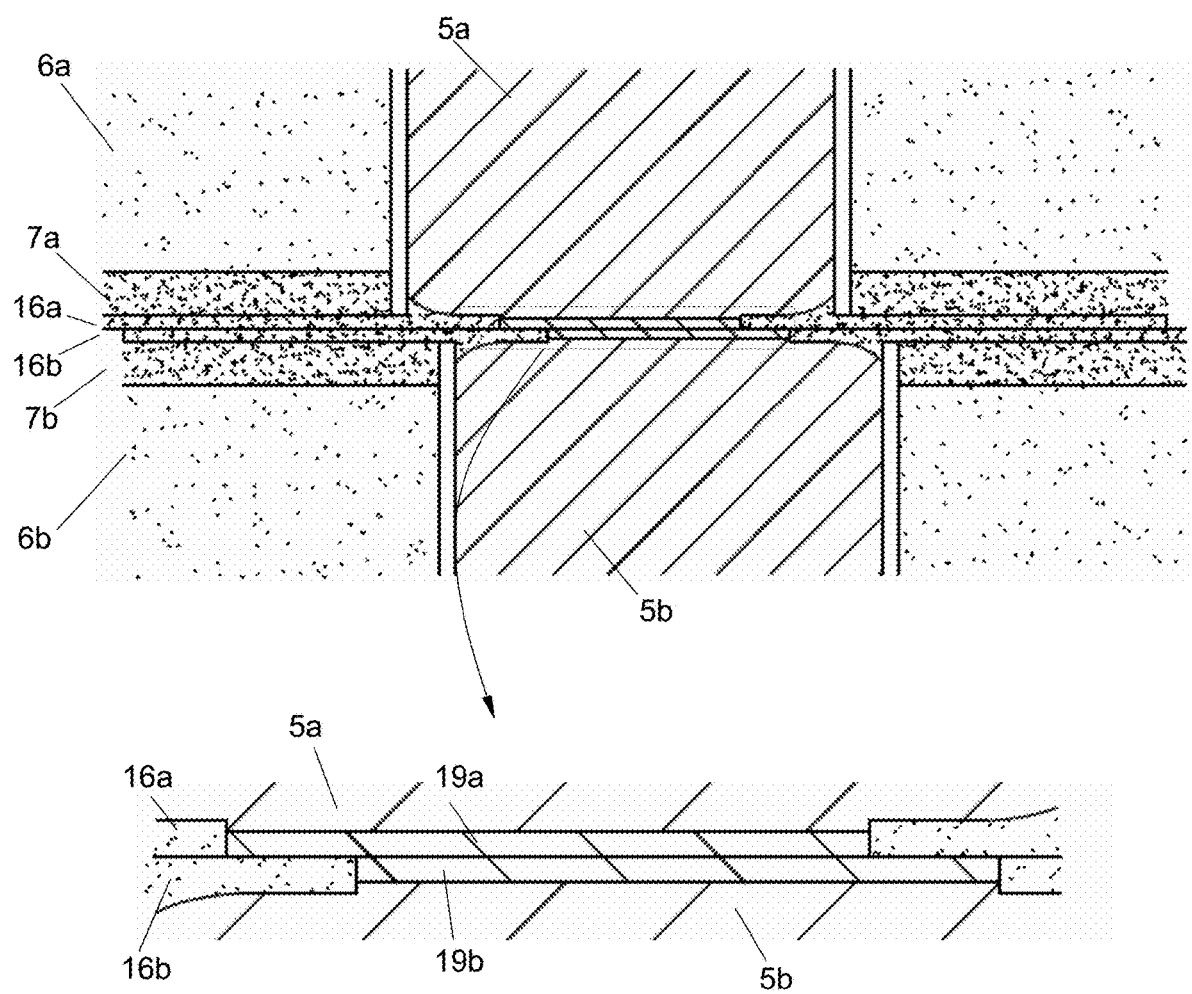

The thus prepared wafers are now ready for bonding. A detail of the bonding process is illustrated in FIGS. 3a to 3c, showing just two mutually facing Cu pads 5a and 5b and their respective dielectric layers 6a/7a and 6b/7b, diffusion barriers 10a and 10b, bonding layers 16a and 16b and Cu patches 19a and 19b in the respective openings 17a and 17b. The top wafer can be aligned to the bottom wafer in the bonding tool. A slight lateral shift is likely to appear as illustrated in the drawing, as a consequence of the alignment accuracy range of the bonding tool. This range is taken into account in the design of the lateral dimensions of the openings 17a and 17b, so that the openings of the two wafers are certain to overlap across at least a portion of their surface area that is large enough to establish an effective electrical connection between the pads 5a and 5b. According to another embodiment, the lateral dimensions of the opening 17a in the top wafer 1a are designed smaller by at least the maximum alignment error of the bonding tool, compared to the opening 17b in the bottom wafer 1b (or vice versa), so that a full overlap of the openings can be ensured. However, a partial overlap is permitted, and the openings 17a and 17b can be of equal size, as is the case in the embodiment shown in the drawings.

Bonding can take place by bringing the wafers into mutual contact, as shown in FIG. 3b, possibly while applying a mechanical pressure that pushes the wafers together. Already at room temperature, a bond can be established between the mutually contacting SiCN layers 16a and 16b. The detail in FIG. 3b shows that when the SiCN layers 16a and 16b enter into contact, a wider gap 20 remains between the overlapping portions of the Cu-patches 19a and 19b, and a more narrow gap 21 between the non-overlapping portions of the patches 19a and 19b and the respective SiCN layers 16b and 16a.

The thus formed assembly can then be subjected to an anneal step, applied at a temperature suitable for further strengthening the SiCN—SiCN bond between the layers 16a and 16b and for realising a thermal expansion of the Cu pads 5a and 5b and of the Cu patches 19a and 19b. As soon as the anneal temperature is reached, and because of the presence of the openings 17a and 17b and the fact that the SiCN layers 16a and 16b have effectively filled the cavities 15 formed after CMP-ing the pads 5a and 5b, thermal expansion of the pads 5a and 5b can quickly cause Cu creep in the form of a bulge-out of the pads through the bottom of the respective openings 17a and 17b, i.e. the material of the pads 5a and 5b is pushed outward through the bottom of the openings 17a and 17b. Through the prior creation of the openings 17a and 17b and the fact that these openings are smaller than the surface area of the Cu pads, the Cu bulge-out is quasi-immediate when the anneal temperature is applied. If the openings would be the same size as the pads, there would be minimal Cu expansion as the largest stress occurs at the interface between the Cu in the pad and the dielectric surrounding it: the adhesion of the pad to the sidewall hinders the protrusion. When the size of the openings 17a and 17b is smaller than the respective underlying pads 5a and 5b, the highest stress point can be located inside the Cu pad and the sidewall adhesion is not hindering the Cu creep. According to some embodiments, the surface area of the openings 17a and 17b is between 25% and 50% of the surface area of the respective pads 5a and 5b.

The disclosure thus greatly increases the amount of Cu expansion during annealing by promoting Cu-creep. The Cu creep can be enhanced, as the metal is hydrostatically confined, except for the smaller opening 17a and 17b on the top surface of the pads 5s. This can cause stress in the metal pad to increase quickly upon annealing, resulting in high stresses at the perimeter of the open area, resulting in Cu creep and the Cu-bulge-out effect.

As seen in FIG. 3c, the Cu bulge-out can push the Cu patches 19a and 19b towards each other to realize an electrically conductive connection by welding the patches together. These patches also undergo a degree of expansion, but it is mainly the bulge-out of the underlying pads 5a and 5b which allows for efficient filling of the gaps 20 and 21. As stated above, no cavities are present along the edges of the Cu patches 19, so that the method enables the formation of an essentially void-free electrical connection between the patches 19a and 19b and thereby between the pads 5a and 5b. The formation of the Cu patches 19a and 19b as such ensures that the initial gaps 20 and 21 are small compared to the combined depths of the openings 17a and 17b, thereby ensuring that these gaps can be filled easily by the effects of the Cu bulge-out of the pads 5a and 5b.

The Cu bulge-out can be related to a number of parameters, which include the volume of the pads 5a and 5b and the area through which the Cu is pushed outward, i.e. the surface area of the openings 17a and 17b in this case. It has been found that the amount of bulge-out for one pad 5a or 5b is in fact proportional to the ratio between the Cu volume of the pad and the surface area of the opening and further depends on the thermal budget applied during the bonding anneal. The volume of the pads can be related to the height of the pads and to the pad area in the plane of the substrates. The height of the pads can be essentially equal (apart from any recess or protrusion) to the combined thickness of the isolating dielectric layers 6+7 (or 6 only in the embodiment of FIGS. 4a to 4f, see further).

As stated in the introduction, bulge-out of copper has been used beneficially in the coupling of different-sized contact pads in the two wafers. However, the use of different-sized pads can inhibit scaling towards smaller pads as the pad size in both wafers needs to take into account not only the size difference but also the inherent alignment accuracy range of the bonding tool, in order for the smaller pad to land fully within the boundaries of the larger pad. Producing the smaller pads can also becomes difficult in terms of etching high aspect ratio openings during damascene processing, which puts a limit on the freedom to design the pad height as a function of a required amount of Cu bulge-out.

The present disclosure enables scaling without these limitations. The lateral pad dimensions can be chosen equal in the top and bottom wafer. This means that there are less limitations to the choice of the pad height. In addition, the surface area of the openings 17a and 17b can be designed together with the pad height as a function of a required amount of bulge-out. The disclosure thereby makes it easier to ensure that sufficient bulge-out occurs, without putting a limit on scaling. Finally, the aspect ratio of the openings 17a and 17b is small, which means that the method can be easily scaled down to even smaller dimensions of the pads 5a and 5b.

Another benefit compared to existing methods is that the method of the disclosure does not require the highly complex CMP recipes used in the prior art for accurately creating a significant and accurately defined recess of the Cu pads on one wafer and corresponding protruding pads on the other wafer. The recess of the Cu patches 19a and 19b can be small and the required accuracy of this recess can be more relaxed, given the fact that the enhanced amount of bulge-out of the Cu pads (compared to conventional methods) is capable of closing this gap within a relatively large range of the gap's dimensions.

Figure 4A:
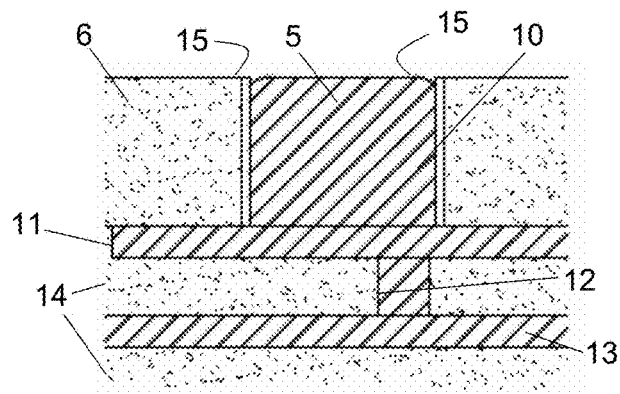
FIGS. 4a to 4f illustrate the method of the disclosure according to an embodiment wherein the bonding layer is deposited directly on a $SiO_x$ layer in which the contact pads are embedded.
Figure 4B:
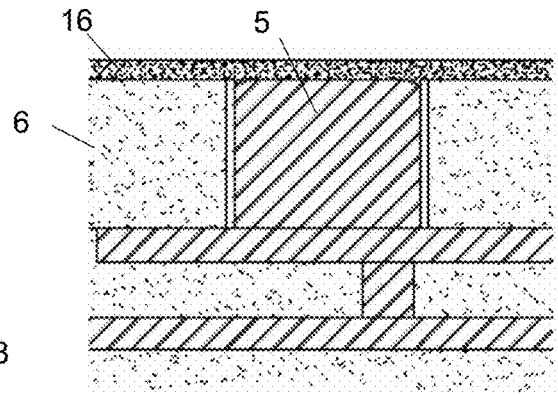
Figure 4C:
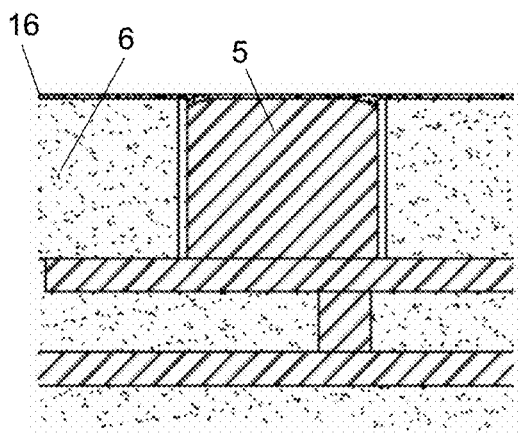
Figure 4D:
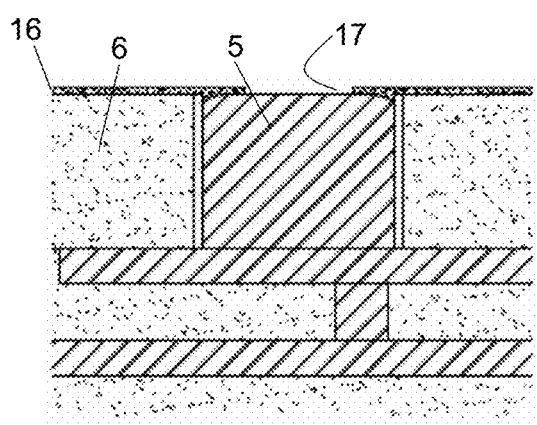
Figure 4E:
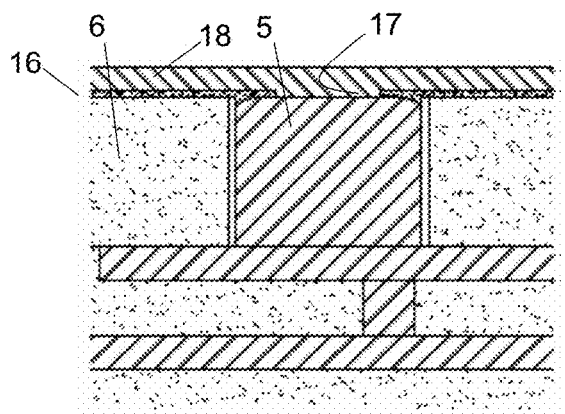
Figure 4F:
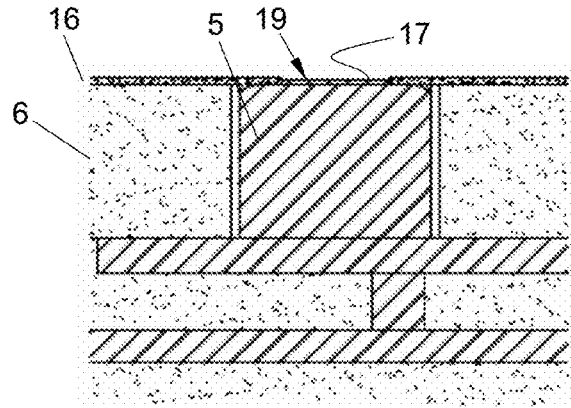

According to an embodiment illustrated in FIGS. 4a to 4f, the first SiCN layer 7 is omitted, i.e. the damascene process for producing the pads is not performed on a stack of $SiO_x$ 6 and SiCN 7 but on a layer 6 of $SiO_x$ (or any other equivalent material) only, as illustrated in FIG. 4a. This can enables the use of standard CMP recipes known from BEOL processing for the planarization of the Cu pads 5. The SiCN bonding layer 16 can now deposited directly on the planarized $SiO_x$ layer 6 and on the planarized Cu pads 5 (FIG. 4b), again filling any cavities 15 appearing at the interface between the surface of the Cu pad 5 and the Ta-containing barrier 10. After this, the steps can be the same as for the first embodiment: thinning the SiCN layer 16 (FIG. 4c), etching the opening 17 (FIG. 4d), depositing the additional Cu layer 18 (FIG. 4e), generally by PVD, and planarizing said layer until obtaining the recessed patch 19 (FIG. 4f).

The Cu layer 18 that fills the openings 17 is typically deposited by PVD, which can be beneficial in that the PVD process enables control of the crystallographic orientation of the deposited copper. This allows the production of the patches 19a and 19b having a particular orientation, chosen to optimize the CMP process (tighter tolerance due to more uniform polishing properties) and to realize improved Cu—Cu bonding (using Cu orientations with a higher atomic surface diffusion rate). The disclosure is however not limited to embodiments wherein the layer 18, and thus the patches 19 are of the same material as the pads 5. For example, when the pads 5 are formed of copper, the patches 19 could be a copper soldering metal, such as Sn, or a more noble metal (to avoid pad oxidation), such as Pt or Au.

Notably, according to any embodiment of the disclosure, the contact structures which are to be electrically connected (for example the pads 5 in the embodiments shown in the drawings), are not subjected (prior to bonding) to any annealing step that exhausts the full potential of the structures for thermal expansion during the bonding anneal. As stated above, a limited amount of Cu expansion can be allowed during preliminary anneal steps, such as annealing required after deposition of the SiCN layers 16. However, such anneal steps are performed at temperatures which allow additional thermal expansion of the Cu during subsequent thermal treatments.

The disclosure is also related to substrates pre-treated according to the method of the disclosure. Embodiments of such substrates include the wafers 1a and 1b described above, provided with the bonding layers 16, openings 17 and contact patches 19. The disclosure is also related to a bonded assembly of such pre-treated substrates. The assembly may comprise two substrates or more, obtainable by repeating the method of the disclosure multiple times in order to obtain a stack of multiple substrates.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be beneficially used. Any reference signs in the claims should not be construed as limiting the scope.

What is claimed:

1. A substrate comprising micro-electronic devices and/or circuitry, the substrate comprising on its surface one or more contact structures formed of an electrically conductive material, the one or more contact structures being laterally embedded in a layer of dielectric material that electrically isolates the one or more contact structures from each other, the substrate further comprising:
   a dielectric bonding layer on the surface of the substrate, the dielectric bonding layer comprising an opening above each of the one or more contact structures, wherein a surface area of the openings lies within respective boundaries of a surface area of the one or more contact structures; and
   in each opening, a patch of an electrically conductive material, lying on and in contact with a surface of each of the one or more contact structures underneath the openings, the patch being recessed relative to a surface of the bonding layer and configured to thermally expand during annealing and provide electrical interconnection between the one or more contact structures of the substrate with one or more contact structures of another substrate.

2. The substrate according to claim 1, wherein lateral dimensions of the one or more contact structures are smaller than 2 µm.

3. The substrate according to claim 1, wherein lateral dimensions of the one or more contact structures are smaller than 1 μm.

4. The substrate according to claim 1, wherein the electrically conductive material of the one or more contact structures and of the patches is a metal.

5. The substrate according to claim 4, wherein the metal of the patches has a different crystallographic orientation than the metal of the one or more contact structures.

* * * * *